US00RE36767E

United States Patent [19]

Itzkowitz

[11] E Patent Number: Re. 36,767

[45] Reissued Date of Patent: Jul. 11, 2000

[54] WAFER SCRUBBING DEVICE

[75] Inventor: Herman Itzkowitz, Montgomery, Pa.

[73] Assignee: Solid State Equipment Corporation, Horsham, Pa.

[21] Appl. No.: 09/257,556

[22] Filed: Feb. 23, 1999

Related U.S. Patent Documents

Reissue of:

[64] Patent No.: 5,675,856
Issued: Oct. 14, 1997
Appl. No.: 08/665,157
Filed: Jun. 14, 1996

[51] Int. Cl.[7] ..... B08B 3/02; B08B 11/02

[52] U.S. Cl. ..... 15/77; 15/88.3; 15/88.4; 15/102

[58] Field of Search ..... 15/21.1, 77, 88.2, 15/88.3, 88.4, 97.1, 102

[56] References Cited

U.S. PATENT DOCUMENTS

| | | | |
|---|---|---|---|
| 3,809,105 | 5/1974 | Horner | 15/77 |
| 3,939,514 | 2/1976 | Cook | 15/88.2 |
| 3,970,471 | 7/1976 | Bankes et al. | 134/6 |
| 4,101,999 | 7/1978 | Doyel | 15/1.51 |
| 4,208,760 | 6/1980 | Dexter et al. | 15/302 |
| 4,520,470 | 5/1985 | d'Alayer de Costemore d'Arc | 369/72 |
| 4,556,433 | 12/1985 | Clausen | 134/6 |
| 4,631,773 | 12/1986 | Graham | 15/4 |
| 4,654,917 | 4/1987 | Yeung | 15/97.1 |
| 4,715,392 | 12/1987 | Abe et al. | 134/62 |
| 4,783,870 | 11/1988 | Yeung | 15/97.1 |
| 4,811,443 | 3/1989 | Nishizawa | 15/97.1 |
| 5,144,711 | 9/1992 | Gill, Jr. | 15/21.1 X |
| 5,146,382 | 9/1992 | Yao-Ko | 360/137 |
| 5,282,289 | 2/1994 | Hasegawa et al. | 15/21.1 |
| 5,317,778 | 6/1994 | Kudo et al. | 15/97.1 X |
| 5,351,360 | 10/1994 | Suzuki et al. | 15/302 |
| 5,357,645 | 10/1994 | Onodera | 15/97.1 |
| 5,375,291 | 12/1994 | Tateyama et al. | 15/302 |
| 5,524,313 | 6/1996 | Sato | 15/97.1 X |

FOREIGN PATENT DOCUMENTS

| | | | |
|---|---|---|---|
| 59-121939 | 7/1984 | Japan | 15/77 |
| 63-239953 | 10/1988 | Japan | 15/88.3 |
| 3-88330 | 4/1991 | Japan | 15/21.1 |

*Primary Examiner*—Mark Spisich
*Attorney, Agent, or Firm*—Seidel, Gonda, Lavorgna & Monaco, PC

[57] ABSTRACT

A wafer scrubbing device for cleaning the surfaces of a thin disk disposed on a stationary spin chuck employs a double brush arrangement whereby brush rotation induces rotation of the disk to be cleaned and whereby the speed differential between the constant rotational speed of the brushes and the [variable] rotational speed of the disk due to the relative position of the brushes on the disk causes the scrubbing of both surfaces and the edge of the disk.

32 Claims, 7 Drawing Sheets

WAFER RPM WITH BRUSH AT 60 RPM

WAFER SCRUBBING DEVICE

Matter enclosed in heavy brackets [ ] appears in the original patent but forms no part of this reissue specification; matter printed in italics indicates the additions made by reissue.

FIELD OF THE INVENTION

The invention relates, generally, to devices for cleaning thin disks such as semiconductor wafers, glass substrates, photomasks, compact disks, and the like. More particularly, the invention relates to a scrubbing device employing a double brush arrangement whereby brush rotation induces rotation of the disk to be cleaned and whereby a speed differential existing between [a constant rotational speed of the brushes and a variable rotational speed of the disk] *a rotational speed of the brushes and a rotational speed of the disk* due to the relative position of the brushes on the disk causes the scrubbing of both sides of the disk and the edge of the disk.

BACKGROUND OF THE INVENTION

The wafers that serve as the substrates for semiconductor elements are sliced from elongated crystals (billets) of material, typically silicon, germanium, or gallium arsenide. The wafers are obtained by sawing the crystals into very thin slices (about a half millimeter thick). These slices are then lapped and polished.

Residual film from lubricants used during slicing as well as air-borne particulates and particles of semiconductor material removed by lapping and polishing tend to adhere to the surfaces of the wafers. This detritus must be removed prior to further processing of the wafers (e.g., masking and etching) to maintain the ultraclean conditions required for such further processing.

Accordingly, in the field of semiconductor manufacture, considerable attention has been directed toward providing devices that are capable of thoroughly cleaning both surfaces of a semiconductor wafer.

SUMMARY OF THE INVENTION

The invention contemplates a wafer scrubbing device that comprises a brush mechanism including a pair of longitudinally extending replaceable brushes. Each brush is mounted on a rotatable shaft, one brush positioned opposite the other. A single drive mechanism is attached to the rotatable shafts of each brush and rotates the brushes in opposite directions. The brush mechanism also includes means for clamping and unclamping the brushes to close or open a gap between the brushes. The brush mechanism further includes means for extending the brushes over both surfaces of a wafer supported on a stationary spin chuck. The wafer rests atop vacuum/pressure pads disposed on supports provided along the periphery of the spin plate of the spin chuck. The pads are adapted to emit a flow of compressed air to create a cushion of air on which the wafer may float. Rollers mounted on the supports adjacent the pads serve to prevent unwanted lateral movement of the wafer.

In operation, the brush mechanism is extended radially with respect to the wafer so that the wafer to be cleaned is positioned between the spaced apart rotating brushes. The rotating brushes are [clamped together and thus are] brought into contact with the wafer. Rotation of the brushes causes the wafer to spin on the cushion of air provided by the vacuum/pressure pads. Additionally, the brushes [are] *may be* caused to move back and forth radially across the wafer surfaces. The brushes rotate at a constant speed while the rotational speed of the wafer varies according to the radial position of the brushes relative to the center of the wafer. This speed differential between the brushes and the wafer causes the desired scrubbing action.

In an alternative embodiment of the invention, a second brush mechanism is provided. The first brush mechanism performs a pre-clean scrub and the second performs a final clean scrub. This arrangement serves to extend the useful life of each of the brushes employed by both brush mechanisms.

All functional elements of the wafer scrubbing device are adapted to be computer controlled.

DESCRIPTION OF THE DRAWINGS

For the purpose of illustrating the invention, there is shown in the drawings a form which is presently preferred; it being understood, however, that this invention is not limited to the precise arrangements and instrumentalities shown.

DESCRIPTION OF THE INVENTION

Figure 1:
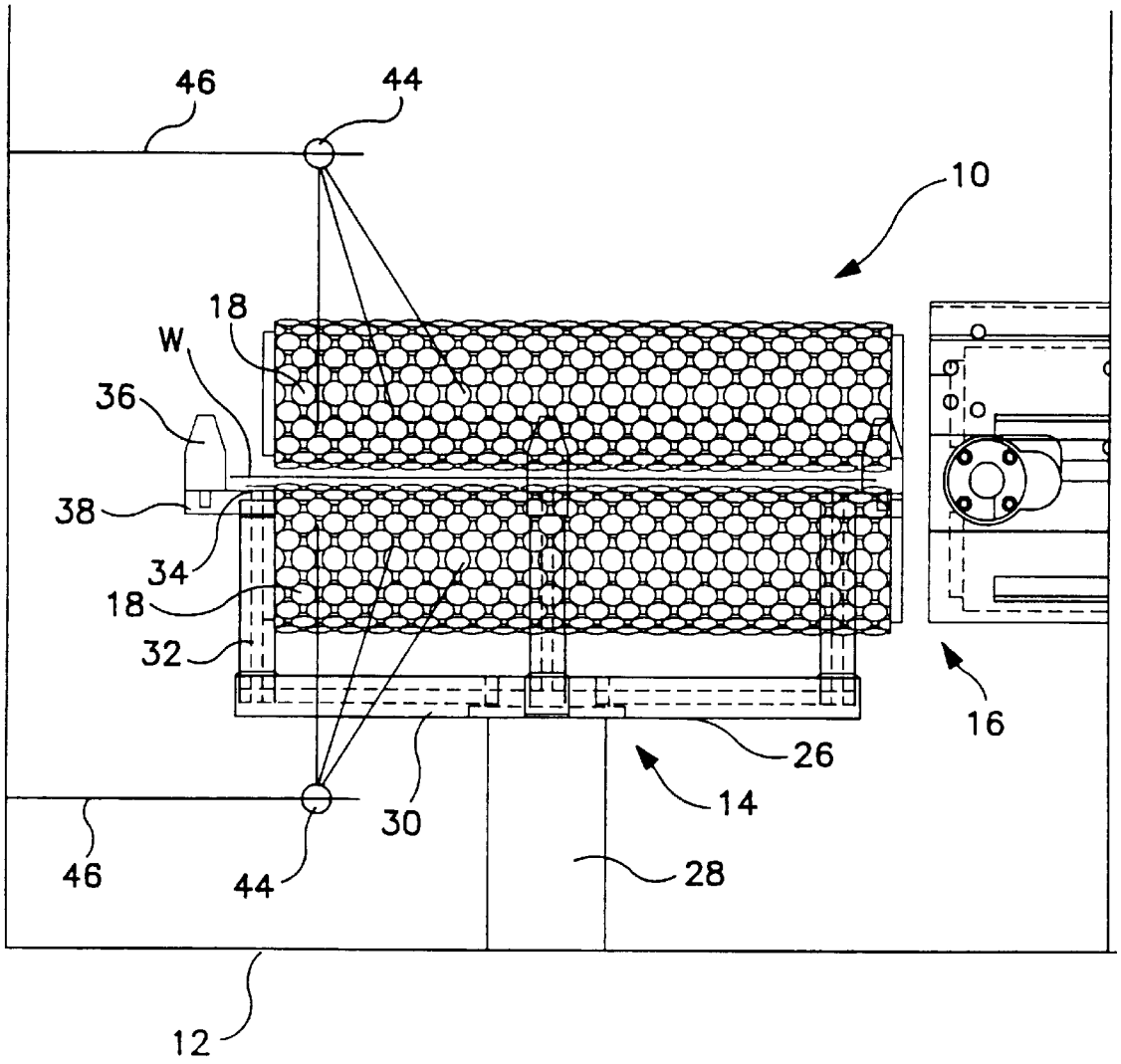
FIG. 1 is a side elevational view of a wafer scrubbing device according to the invention.

Referring now to the drawings, wherein like numerals indicate like elements, there is shown in FIG. 1 a wafer scrubbing device 10 according to the present invention. The wafer scrubbing device 10 is preferably contained within a single enclosure 12. The scrubbing device 10 comprises a spin chuck 14 for supporting a wafer W to be cleaned. The device 10 also comprises a brush mechanism 16 which includes a pair of brushes 18 for scrubbing the wafer W. The brush mechanism 16 also includes a drive mechanism 20 for rotating the brushes, a clamping mechanism 22 for clamping and unclamping the brushes, and a motor 24 for driving the brushes radially across the surfaces of the wafer W.

Figure 2:
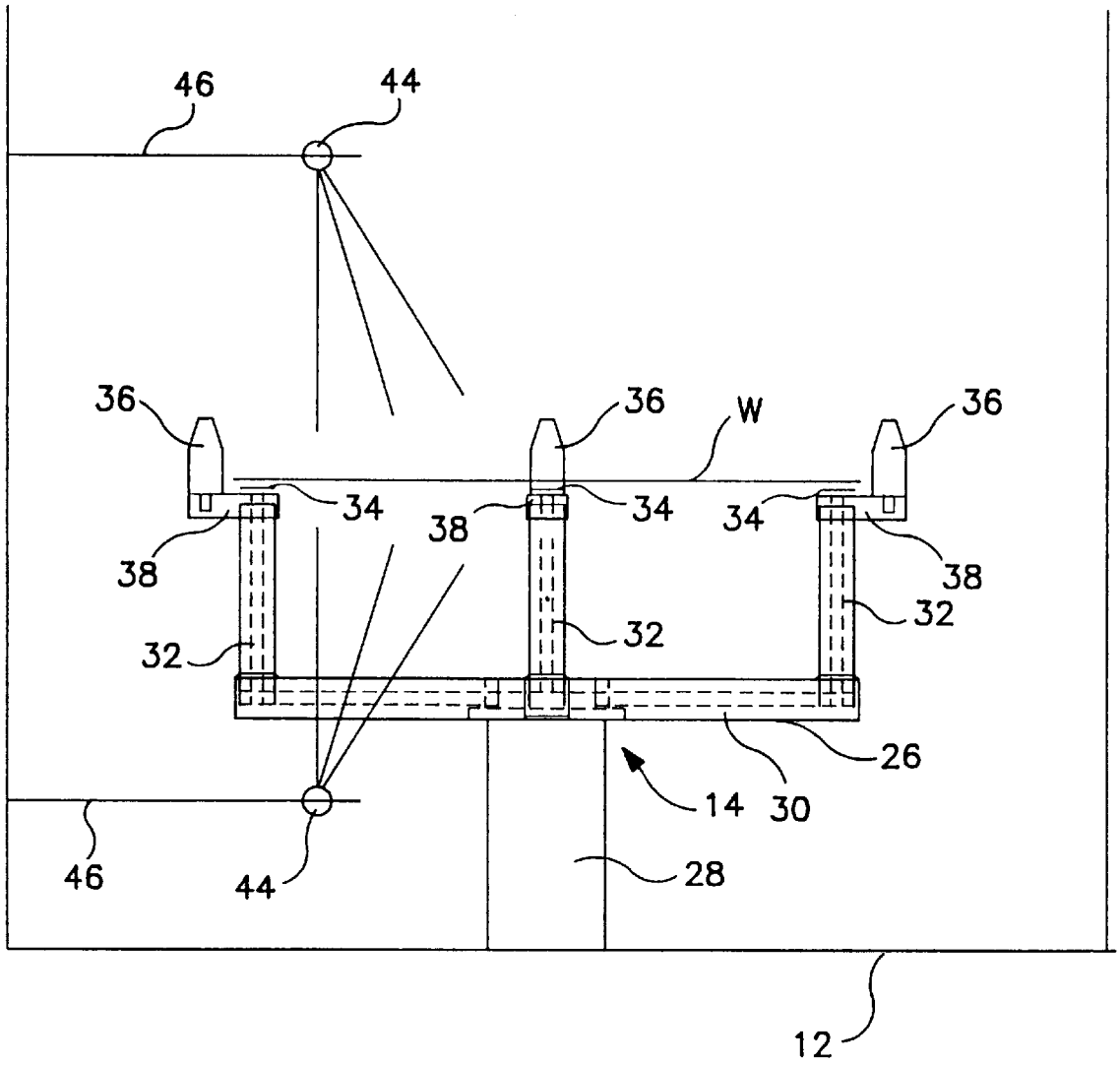
FIG. 2 is a side elevational view of a spin chuck, showing a wafer disposed thereon.
Figure 3:
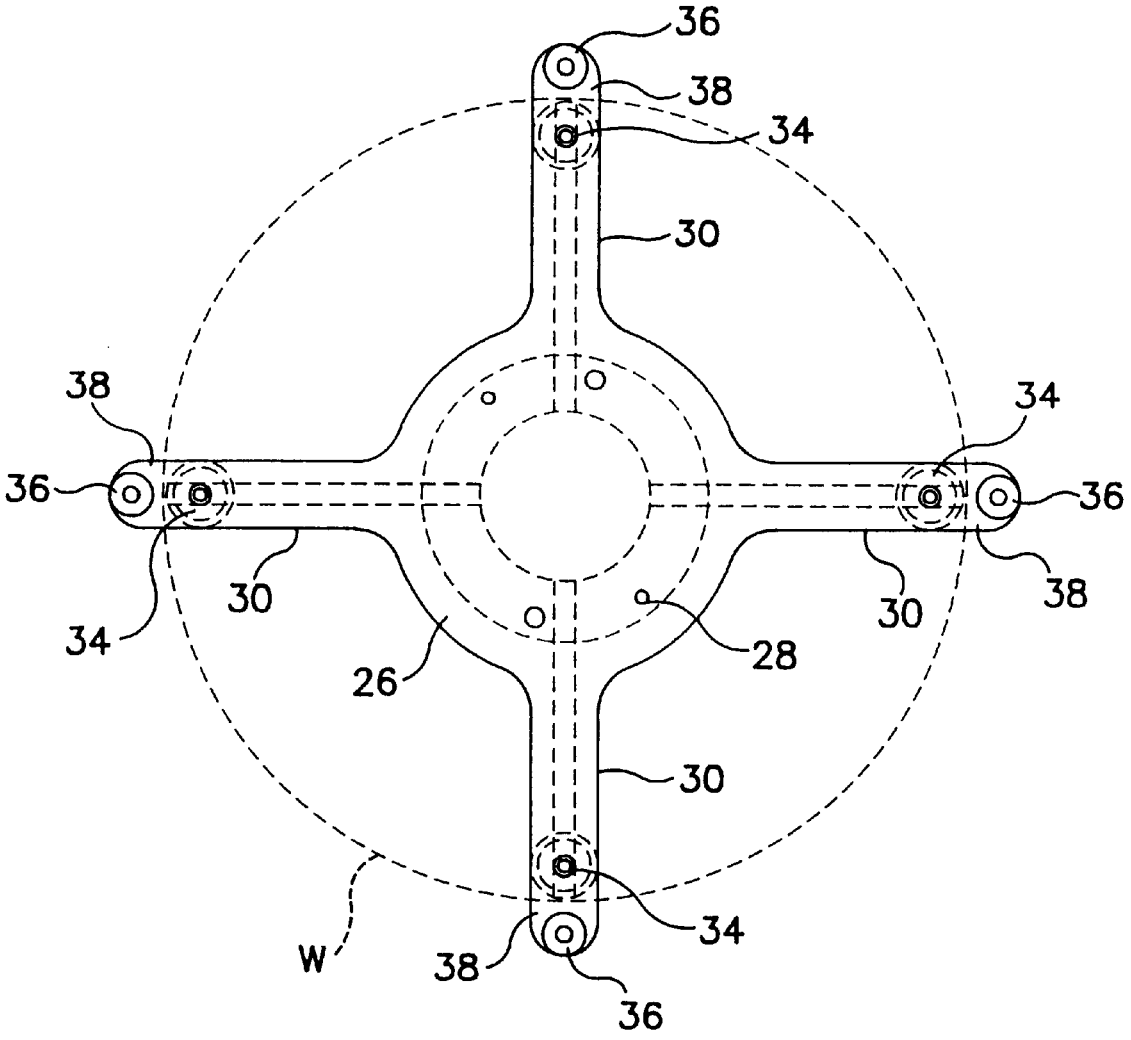
FIG. 3 is a top view of the spin chuck, showing a wafer (in phantom) disposed thereon.

Referring back to FIG. 1, the spin chuck 14 has an interchangeable spin plate 26 (also shown in FIG. 3) mounted on a spin chuck shaft 28. Both the shaft 28 and the spin plate 26 are adapted to be turned by a spin motor (not shown). Plural support arms 30 extend radially from the spin plate 26. As best shown in FIG. 2, a support member 32 extends from the end of each of the radial support arms 30. A vacuum/pressure pad 34 is provided on the end of each of the support members 32. The pads 34 support the wafer W on the spin chuck 14 and represent the sole contact points between the chuck and the wafer. The pads 34 are capable of holding the wafer W firmly in position by vacuum suction when the chuck 14 is spinning (i.e., during wafer processing steps other than brush scrubbing). Additionally, the pads 34 are adapted to emit a flow of compressed air to create a cushion of air upon which the wafer W may float. It will be apparent that the air cushion facilitates the free rotation of the wafer during the scrubbing process described below. Rollers 36 are disposed adjacent the pads 34 and are located on platforms 38 which are attached to the ends of the support members 32 and which extend outwardly therefrom. By this arrangement, the rollers 36 are positioned along the rim of the wafer W to prevent lateral movement of the wafer while permitting the wafer the freedom to rotate in situ during the scrubbing process. It should be appreciated that since the spin plate is interchangeable, the spin chuck may be configured to accommodate wafers of various diameters, as well as wafers with a fat, merely by providing a spin plate (chosen from a set of interchangeable spin plates of various proportions) having the proper respective dimensions.

Figure 4:
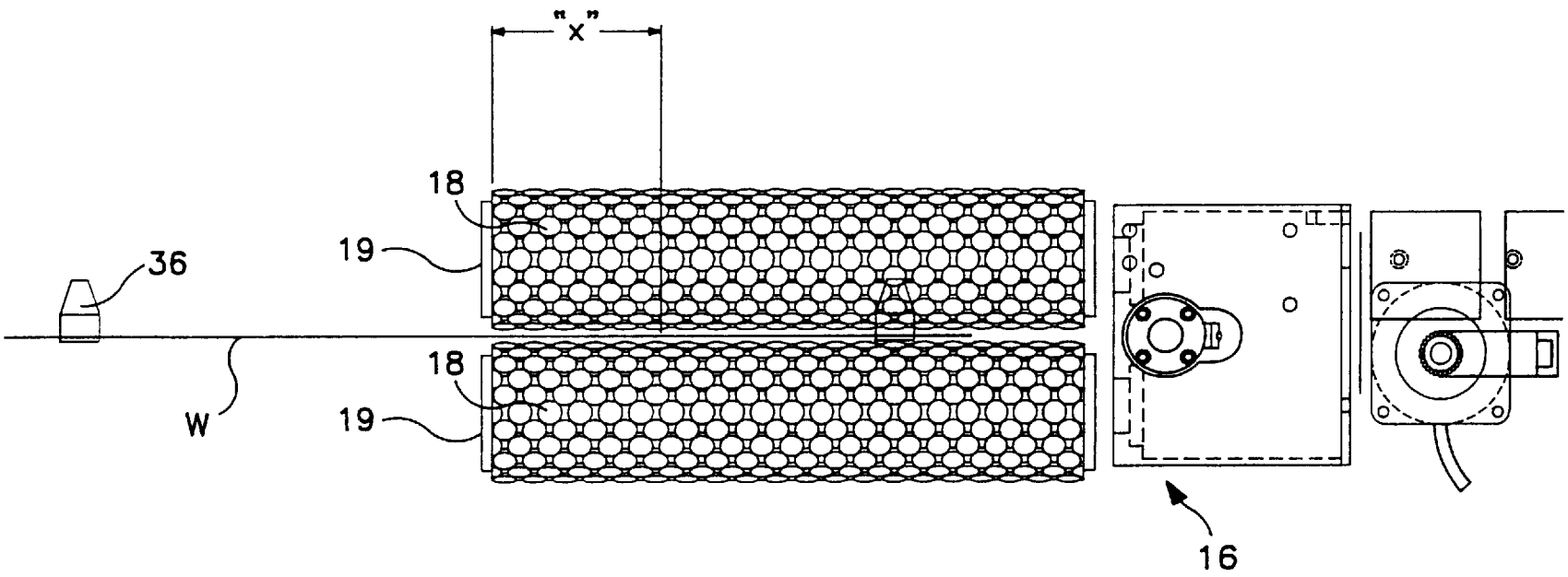
FIG. 4 is a partial side elevational view of a wafer scrubbing device according to the invention.
Figure 5:
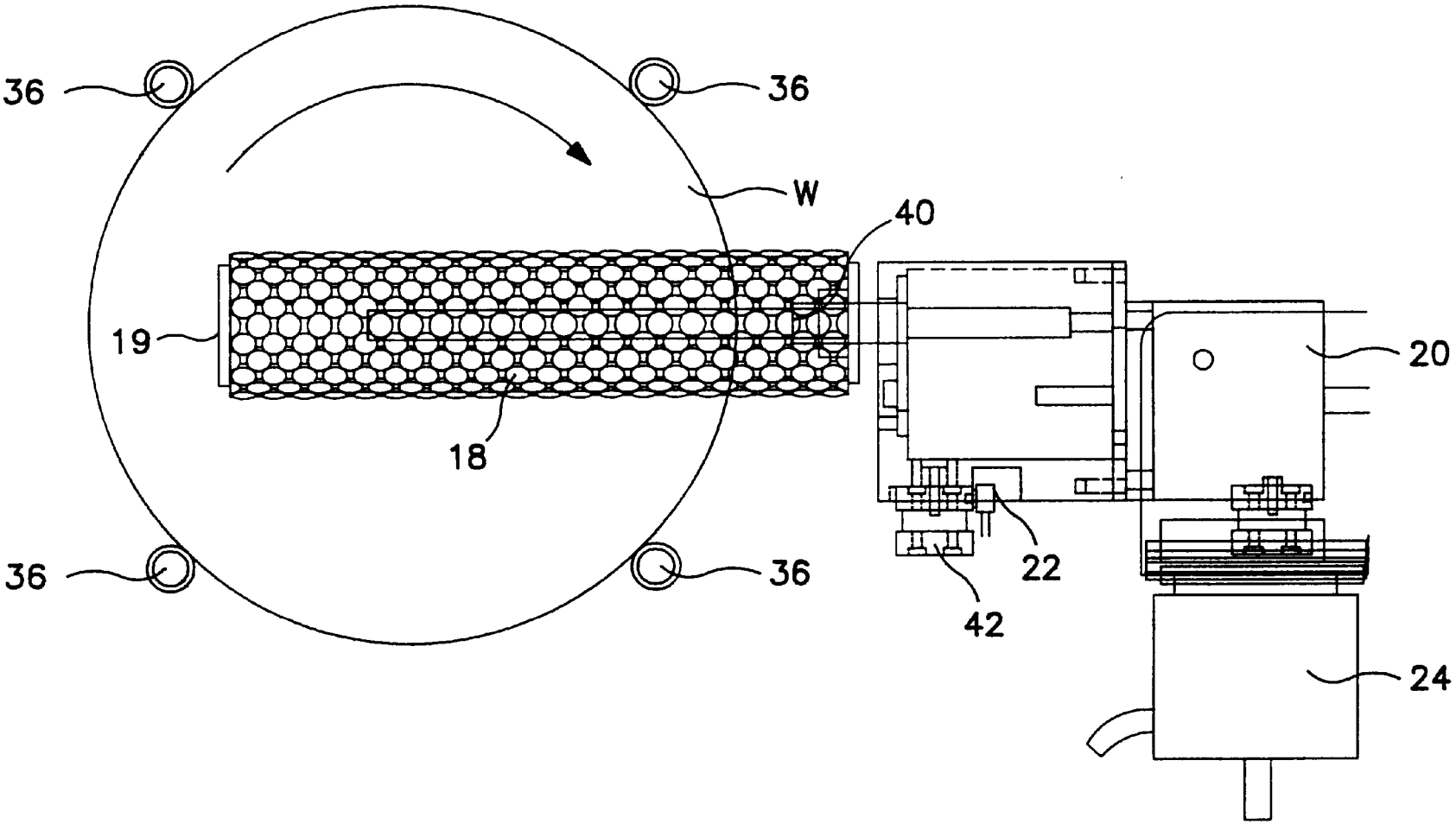
FIG. 5 is a partial top plan view of a wafer scrubbing device according to the invention.

As shown in FIGS. 1, 4, and 5, the brush mechanism 16 includes a pair of longitudinally extending brushes 18. Although illustrated as having a cylindrical shape, it should be apparent that each of the brushes 18 could also have a frustoconical shape or other shape. Additionally, each of the brushes 18 may be provided in different sizes to accommodate a variety of wafer sizes. Desirably, the brushes 18 are easily replaceable and are formed from poly vinyl acetate (PVA) or other porous or sponge-like material. However, the brushes may also be formed from nylon bristles or the like.

Each of the brushes 18 is mounted on a rotatable shaft 40, one brush positioned opposite the other on either side of the wafer W. The rotatable shafts 40 are capable of being spun (about their respective central axes) in opposite directions and at a constant speed, preferably by one drive mechanism 20. Drive mechanism 20 may comprise a stepper motor or servo motor cooperating with a gear and belt coupling (not shown).

The brush mechanism 16 also includes a clamping mechanism 22 for clamping and unclamping the brushes 18 to close or open a gap between the brushes. The clamping mechanism 22 (shown in FIG. 5) preferably includes a clamp cylinder 42 that cooperates with the shafts 40 through a known mechanical linkage to move the brushes 18 toward and away from each other in response to manipulation of the air pressure in the cylinder.

The brush mechanism 16 further includes a motor 24 for providing longitudinal movement (i.e., movement along the axes of the shafts 40) of the brushes 18 by means of a belt drive, a lead screw, a chain drive, or the like.

The brush mechanism 16 and the spin chuck 14 preferably are connected to the output side of a controller (not shown). Desirably, the controller includes a CPU, ROM, and RAM and sends command signals according to a predetermined program for controlling all facets of the operation of the wafer scrubbing device 10, particularly the rotation, the clamping, and the positioning of the brushes 18. It should be understood that the structure of the controller and its adaptation to perform the functions required of it, with respect to the device 10, fall well within the realm of ordinary skill in the art.

In operation of the wafer scrubbing device 10 of the invention, the wafer W is placed on the vacuum/pressure pads 34 of the stationary spin chuck 14 either manually or, preferably, by means of an automated wafer handler such as a robot arm (not shown). The clamping mechanism 22 opens a gap between the brushes 18 and the brushes are extended radially so that the wafer W to be cleaned is positioned therebetween (avoiding the support members 32). Desirably, the distal ends 19 of the brushes 18 will not extend past about ¾ of the diameter of the wafer W, for reasons that are discussed below in relation to FIG. 6. The brushes 18 are then driven to rotate in opposite directions and at a constant speed by the drive mechanism 20. The clamping mechanism 22 causes the brushes 18 to close against the surfaces of the wafer W, thereby causing the wafer to spin on the cushion of air introduced by the vacuum/pressure pads 34 disposed on the stationary spin chuck 14. Desirably, each of the brushes 18 applies even and equal pressure to the wafer surfaces. It is therefore preferred that the amount of pressure exerted against the wafer surfaces by the brushes 18 be subject to the control of the controller (it being understood that the application of the controller for this purpose is well within the realm or ordinary skill in the art). The brushes 18 are then driven by the motor 24 back and forth radially across the wafer surfaces, achieving brush converge over the entire surface area of both wafer surfaces and the edge.

Figure 6:
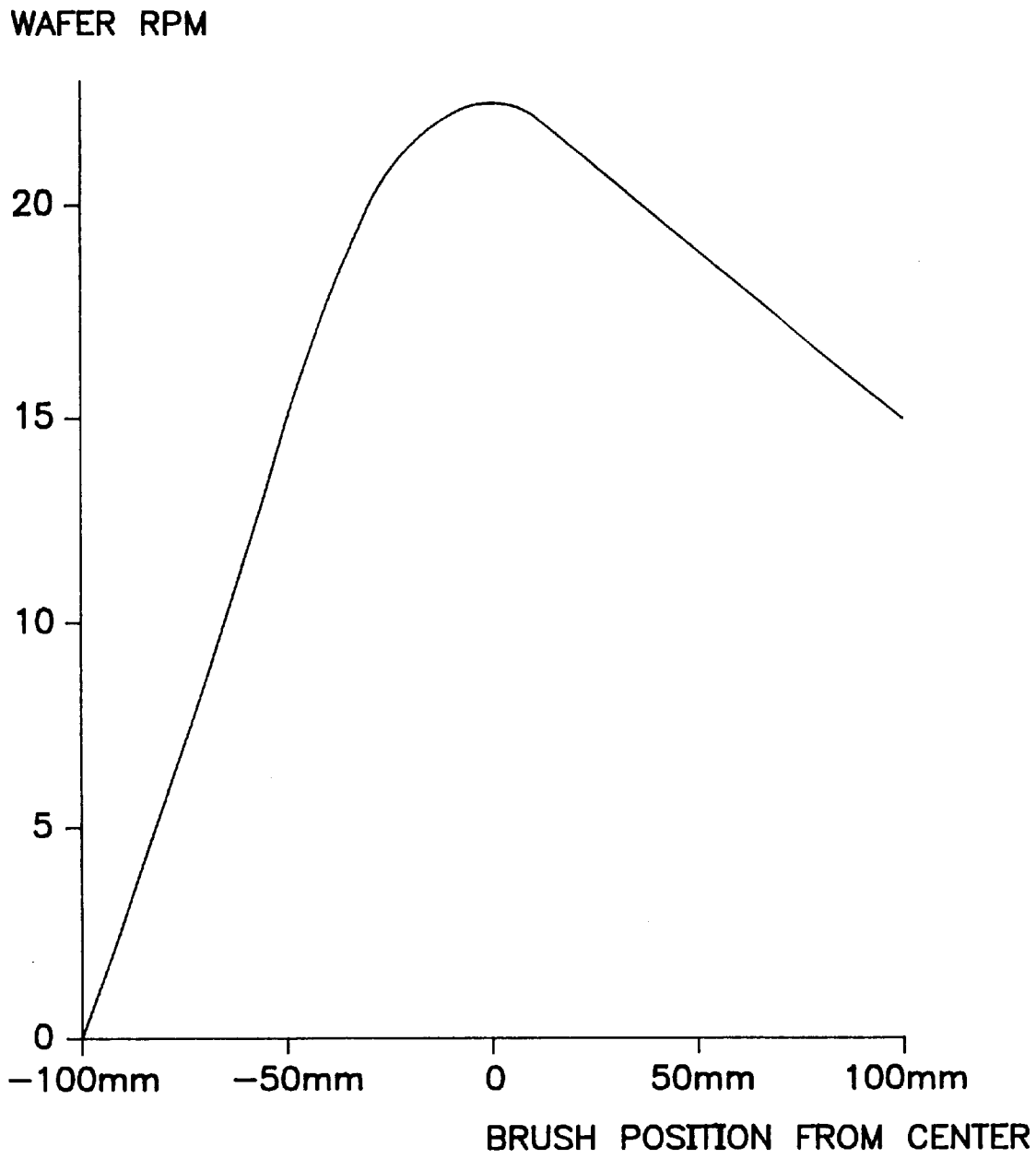
FIG. 6 is a graphical representation of the relationship between wafer rotational speed and brush position.

Scrubbing action results from the speed differential between the rotational speed of the brushes 18, which is held constant, and the rotational speed of the wafer surfaces, which varies according to the radial distance of the distal ends 19 of the brushes from the center of the wafer W. FIG. 6 graphically illustrates the relationship of brush position to wafer rotational speed. According to FIG. 6, when brushes rotating at a constant 60 RPM extend completely across a typical wafer having a diameter of 200 mm (position "−100 mm"), they do not induce wafer rotation and, hence, do not cause frictional scrubbing of the entire surface area of both wafer surfaces. However, when the distal ends of the brushes extend to the center of the wafer (position "0"), they induce maximum rotation of the wafer surfaces with brush coverage over the entire surface area of both wafer surfaces and the edge.

FIG. 4 shows the brushes 18 positioned to provide typical frictional scrubbing. In FIG. 4, "X" describes the radial distance between the center of the wafer W and a point falling approximately ¼ of the way across the diameter of the wafer. It is this distance that defines the preferred range of motion of the brushes 18 (as measured from their distal ends 19) with respect to the wafer surfaces. It should be appreciated that some variation in "X" is desirable to produce optimal results.

During the scrubbing process it is desirable to direct streams of water or streams of a cleaning solution at both surfaces of the spinning wafer to wash away particulates. As shown in FIGS. 1 and 2, this is accomplished by providing spray nozzles 44 positioned above and below the wafer W. The spray nozzles 44 are preferably connected to a source of pure water or cleaning solution through supply pipes 46. The flow rate of the water or cleaning solution may be controlled by a pump and valve arrangement (not shown) which is, in turn, controlled by the controller (it being understood that application of the controller for this purpose is well within the realm of ordinary skill in the art).

Once the scrubbing process is complete, the spray nozzles 44 stop emitting water or cleaning fluid and excess water or fluid is drained off by conventional means. The brushes 18 cease to rotate and are unclamped and retracted. The vacuum/pressure pads 34 cease to emit a flow of compressed air and instead, introduce vacuum suction to hold the wafer W in place on the spin chuck 14 in preparation for an optional second rinsing of the wafer and in preparation for spin drying the wafer. Spin drying involves rotating the spin chuck 14 at high speed with the wafer W held in place thereon for a time sufficient to dry the wafer surfaces. It should be apparent that the optional second rinse may be made unnecessary by operating the spray nozzles continuously until the spin drying phase begins.

Figure 7:
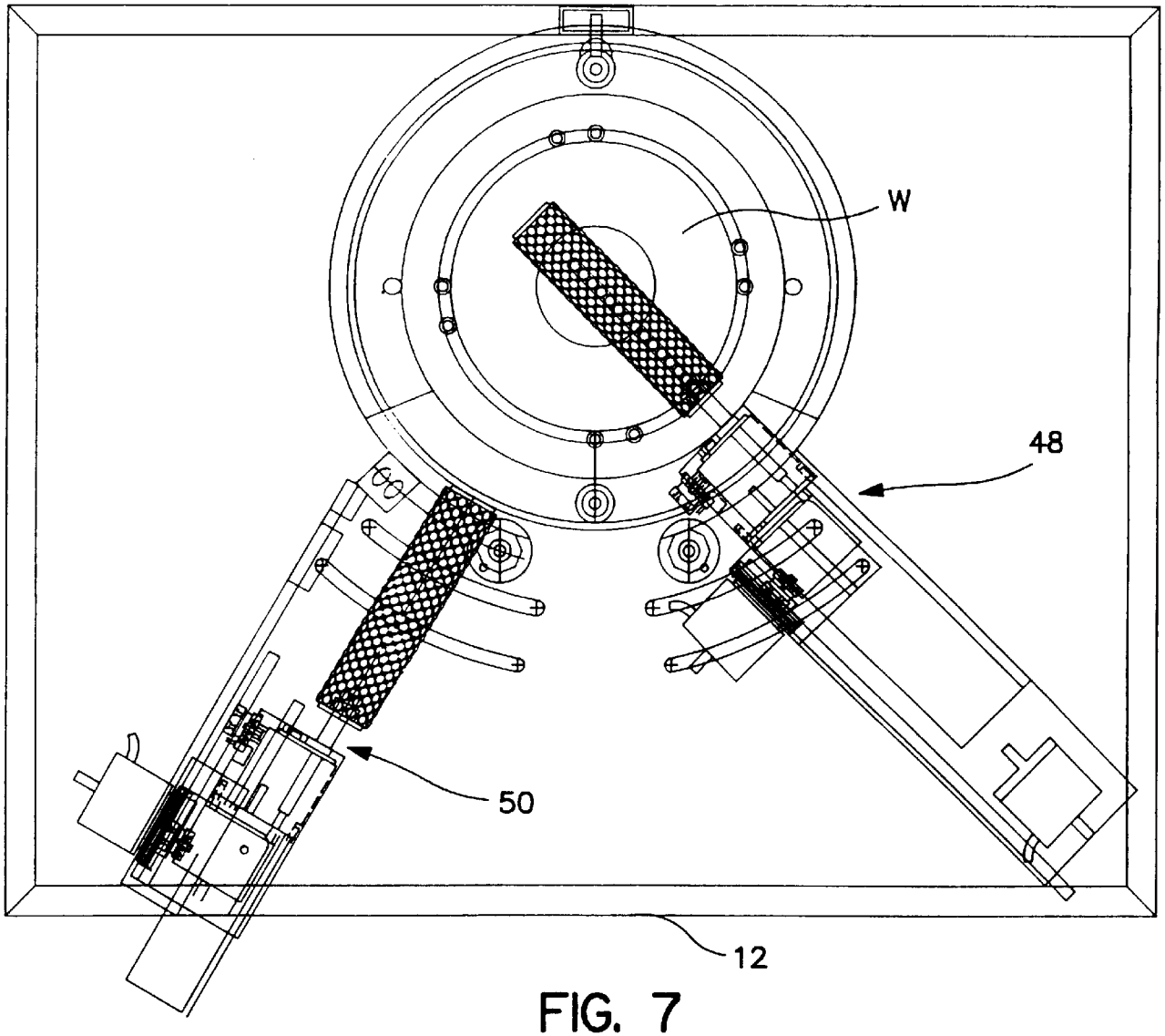
FIG. 7 is a top plan view of an alternative embodiment of the invention, incorporating two brush mechanisms.

An alternative embodiment of the invention illustrated in FIG. 7 incorporates two brush mechanisms 48 and 50, each the same as the brush mechanism 16. Although the brush mechanisms 48 and 50 are shown disposed approximately 90° apart, it should be apparent that the brush mechanisms may be disposed at some other relative angular position (e.g., 180° apart). By providing two brush mechanisms 48 and 50, the alternative wafer scrubbing device can provide a pre-clean scrub and a final clean scrub. This serves to extend the useful life of the brushes employed by each brush mechanism 48 and 50.

It should be appreciated that contamination in the form of spin tool footprint and chuck marking are eliminated by the wafer scrubbing device 10 of the invention.

The present invention may be embodied in other specific forms without departing from the spirit or essential attributes thereof and, accordingly, reference should be made to the appended claims, rather than to the foregoing specification, as indicating the scope of the invention.

What is claimed is:

1. A scrubbing device for cleaning a thin disk, comprising:

a disk holder;

a brush mechanism including a pair of brushes, means for rotating each of the brushes at a constant speed in opposite directions, means for clamping together and unclamping the brushes with the disk positioned therebetween, and means for extending the brushes back and forth radially across surfaces of the disk, rotation of the brushes inducing variable rotation of the disk, the radial movement of the brushes creating a speed differential between the constant rotational speed of the brushes and the variable rotational speed of the disk due to the relative position of the brushes on the disk, the differential causing frictional scrubbing of the surfaces and edge of the disk.

2. A scrubbing device as in claim 1, wherein the brushes are replaceable.

3. A scrubbing device as in claim 1, wherein the disk holder is a spin chuck.

4. A scrubbing device as in claim 3, wherein the spin chuck includes an interchangeable spin plate.

5. A scrubbing device as in claim 3, wherein the spin chuck includes vacuum/pressure pads adapted to both emit a flow of compressed air to create a cushion of air on which the disk can float and to hold the disk down in stationary position by vacuum suction.

6. A scrubbing device as in claim 1, wherein the rotating means comprises a stepper motor for driving rotatable shafts upon which the brushes are mounted.

7. A scrubbing device as in claim 1, wherein the rotating means comprises a servo motor for driving rotatable shafts upon which the brushes are mounted.

8. A scrubbing device as in claim 1, wherein the clamping means comprises a clamp cylinder.

9. A scrubbing device as in claim 1, wherein the extending means comprises a motor.

10. A scrubbing device as in claim 1, further comprising spray nozzles for directing a stream of fluid at the surfaces of the disk.

11. A scrubbing device as in claim 1, further comprising a controller for controlling the operation of the disk holder, the rotating means, the clamping means, and the extending means.

12. A scrubbing device for cleaning a thin disk, comprising:

a disk holder;

plural brush mechanisms, each of the brush mechanisms including a pair of brushes, means for rotating each of the brushes at a constant speed in opposite directions, means for clamping together and unclamping the brushes with the disk positioned therebetween, and means for extending the brushes back and forth radially across surfaces of the disk, rotation of the brushes inducing variable rotation of the disk, the radial movement of the brushes creating a speed differential between the constant rotational speed of the brushes and the variable rotational speed of the disk due to the relative position of the brushes on the disk, the differential causing frictional scrubbing of the surfaces and edge of the disk.

13. A scrubbing device as in claim 12, wherein the brushes are replaceable.

14. A scrubbing device as in claim 12, wherein the disk holder is a spin chuck.

15. A scrubbing device as in claim 14, wherein the spin chuck includes an interchangeable spin plate.

16. A scrubbing device as in claim 14, wherein the spin chuck includes vacuum/pressure pads adapted to both emit a flow of compressed air to create a cushion of air on which the disk can float and to hold the disk down in stationary position by vacuum suction.

17. A scrubbing device as in claim 12, wherein the rotating means comprises a motor for driving rotatable shafts upon which the brushes are mounted.

18. A scrubbing device as in claim 12, wherein the clamping means comprises a clamp cylinder.

19. A scrubbing device as in claim 12, wherein the extending means comprises a motor.

20. A scrubbing device as in claim 12, further comprising a controller for controlling the operation of the disk holder, the rotating means, the clamping means, and the extending means.

*21. A scrubbing device for cleaning a thin disk, comprising:*

*a spin chuck, wherein the spin chuck includes a vacuum/pressure pads adapted to both emit a flow of compressed air to create a cushion of air on which the disk can float and to hold the disk down in stationary position by vacuum suction; and*

*a brush mechanism including a pair of brushes positioned to contact surfaces of a disk and means for rotating each of the brushes in opposite directions, rotation of the brushes inducing rotation of the disk, the position of the brushes creating a speed differential between the rotational speed of the brushes and the rotational speed of the disk due to the relative position of the brushes on the disk, the differential causing frictional scrubbing of the surfaces and edge of the disk.*

*22. A scrubbing device as in claim 21, wherein the brushes are replaceable.*

*23. A scrubbing device as in claim 21, wherein the spin chuck includes an interchangeable spin plate.*

*24. A scrubbing device as in claim 21, wherein the rotating means comprises a stepper motor for driving rotatable shafts upon which the brushes are mounted.*

*25. A scrubbing device as in claim 21, wherein the rotating means comprises a servo motor for driving rotatable shafts upon which the brushes are mounted.*

*26. A scrubbing device as in claim 21, further comprising spray nozzles for directing a stream of fluid at the surfaces of the disk.*

*27. A scrubbing device as in claim 21, wherein the brushing mechanism further comprises means for position-*

*ing the brushes on the disk, the scrubbing device further comprises a controller for controlling the operation of the spin chuck, the rotating means, and the positioning means.*

*28. A scrubbing device for cleaning a thin disk, comprising:*

*a spin chuck, wherein the spin chuck includes vacuum/pressure pads adapted to both emit a flow of compressed air to create a cushion of air on which the disk can float and to hold the disk down in stationary position by vacuum suction; and*

*plural brush mechanisms, each of the brush mechanisms including a pair of brushes positioned to contact surfaces of the disk, and means for rotating each of the brushes in opposite directions, rotation of the brushes inducing rotation of the disk, the position of the brushes creating a speed differential between the rotational speed of the brushes and the rotational speed of the disk due to the relative position of the brushes on the disk, the differential causing frictional scrubbing of the surfaces and edge of the disk.*

*29. A scrubbing device as in claim 28, wherein the brushes are replaceable.*

*30. A scrubbing device as in claim 28, wherein the spin chuck includes an interchangeable spin plate.*

*31. A scrubbing device as in claim 28, wherein the rotating means comprises a motor for driving rotatable shafts upon which the brushes are mounted.*

*32. A scrubbing device as in claim 28, wherein each brushing mechanism further comprises means for positioning the brushes on the disk, the scrubbing device further comprising a controller for controlling the operation of the spin chuck, the rotating means, and the positioning means.*

* * * * *